US008866544B2

(12) United States Patent
Llewellyn

(10) Patent No.: US 8,866,544 B2
(45) Date of Patent: Oct. 21, 2014

(54) CLASS D PULSE WIDTH MODULATOR WITH DUAL FEEDBACK

(75) Inventor: William D. Llewellyn, San Jose, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 66 days.

(21) Appl. No.: 13/445,574

(22) Filed: Apr. 12, 2012

(65) Prior Publication Data

US 2012/0262211 A1    Oct. 18, 2012

Related U.S. Application Data

(60) Provisional application No. 61/475,805, filed on Apr. 15, 2011.

(51) Int. Cl.
*H03F 3/38*     (2006.01)
*H03F 3/217*    (2006.01)

(52) U.S. Cl.
CPC ..................................... *H03F 3/217* (2013.01)
USPC .......................... 330/10; 330/251; 330/207 A

(58) Field of Classification Search
CPC ........................................................ H03F 3/38
USPC .......................... 330/10, 251, 207 A; 375/238
See application file for complete search history.

(56) References Cited

U.S. PATENT DOCUMENTS 7,414,471 B2 *   8/2008   Krishnan et al. .............. 330/251
7,733,170 B2 *   6/2010   Cheng .............................. 330/10

FOREIGN PATENT DOCUMENTS

CN        102739208 A      10/2012
KR    10-2012-0117688      10/2012

OTHER PUBLICATIONS

Chinese Application Serial No. 201210110792.9, Amendment Filed Apr. 23, 2012, 31 pgs.
Chinese Application Serial No. 201220160793.X, Office Action mailed Aug. 30, 2012, 2 pgs.
Chinese Application Serial No. 201220160793.X, Response filed Oct. 26, 2012 to Office Action mailed Aug. 30, 2012, 6 pgs.

* cited by examiner

*Primary Examiner* — Robert Pascal
*Assistant Examiner* — Khiem Nguyen
(74) *Attorney, Agent, or Firm* — Schwegman, Lundberg & Woessner, P.A.

(57) ABSTRACT

This document discusses, among other things, a modulator including a first integrator configured to receive an input signal and a first feedback signal from an output stage, a second integrator configured to receive an output of the first integrator and a second feedback signal, and a comparator configured to be coupled to a regulated supply voltage, to receive an output of the second integrator and a modulation signal, and to provide a pulse width modulated representation of the input signal. The output stage is configured to be coupled to an unregulated supply voltage, and the second feedback signal can include a representation of an output of the comparator configured to reduce artifacts in the pulse width modulated representation of the input signal induced by changes in an amplitude of the unregulated supply voltage.

17 Claims, 6 Drawing Sheets

CLASS D PULSE WIDTH MODULATOR WITH DUAL FEEDBACK

CLAIM OF PRIORITY

This patent application claims the benefit of priority, under 35 U.S.C. Section 119(e), to Llewellyn, U.S. Provisional Patent Application Ser. No. 61/475,805, entitled "CLASS D PULSE WIDTH MODULATOR WITH DUAL FEEDBACK," filed on Apr. 15, 2011, which is hereby incorporated by reference herein in its entirety.

BACKGROUND

Class-D switching audio amplifiers can employ a continuous-time, sigma-delta type architecture in the modulator block. For example, instead of a simple cascaded gain stage fed into a slicer/comparator together with a high frequency ramp signal (>10× the highest frequency in the baseband), integrators can be employed to achieve a shaped transfer characteristic having very high gain in the baseband region, and therefore low distortion. The integrators can also be employed to drive switching noise to frequencies well outside of the band of interest. The overall loop can be closed by acquiring the feedback signal directly from the output terminals for introduction into the summing nodes of the integrators. However, in many applications—such as battery-operated systems—the power supply voltage at the output stage can vary over as much as a 2:1 operating range. This produces a corresponding variation in the energy fed back into the integrators that can negatively influence modulator stability, as well as give rise to artifacts such as bimodal modulation.

OVERVIEW

This document discusses, among other things, a modulator including a first integrator configured to receive an input signal and a first feedback signal from an output stage, a second integrator configured to receive an output of the first integrator and a second feedback signal, and a comparator configured to be coupled to a regulated supply voltage, to receive an output of the second integrator and a modulation signal, and to provide a pulse width modulated representation of the input signal. The output stage is configured to be coupled to an unregulated supply voltage, and the second feedback signal can include a representation of an output of the comparator configured to reduce artifacts in the pulse width modulated representation of the input signal induced by changes in an amplitude of the unregulated supply voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, an architecture that can reduce or eliminate output voltage dependency otherwise present in feedback provided to the second stage of a second-order class-D modulator, thus, ameliorating stability issues as well as mitigating bimodal concerns.

Figure 1:
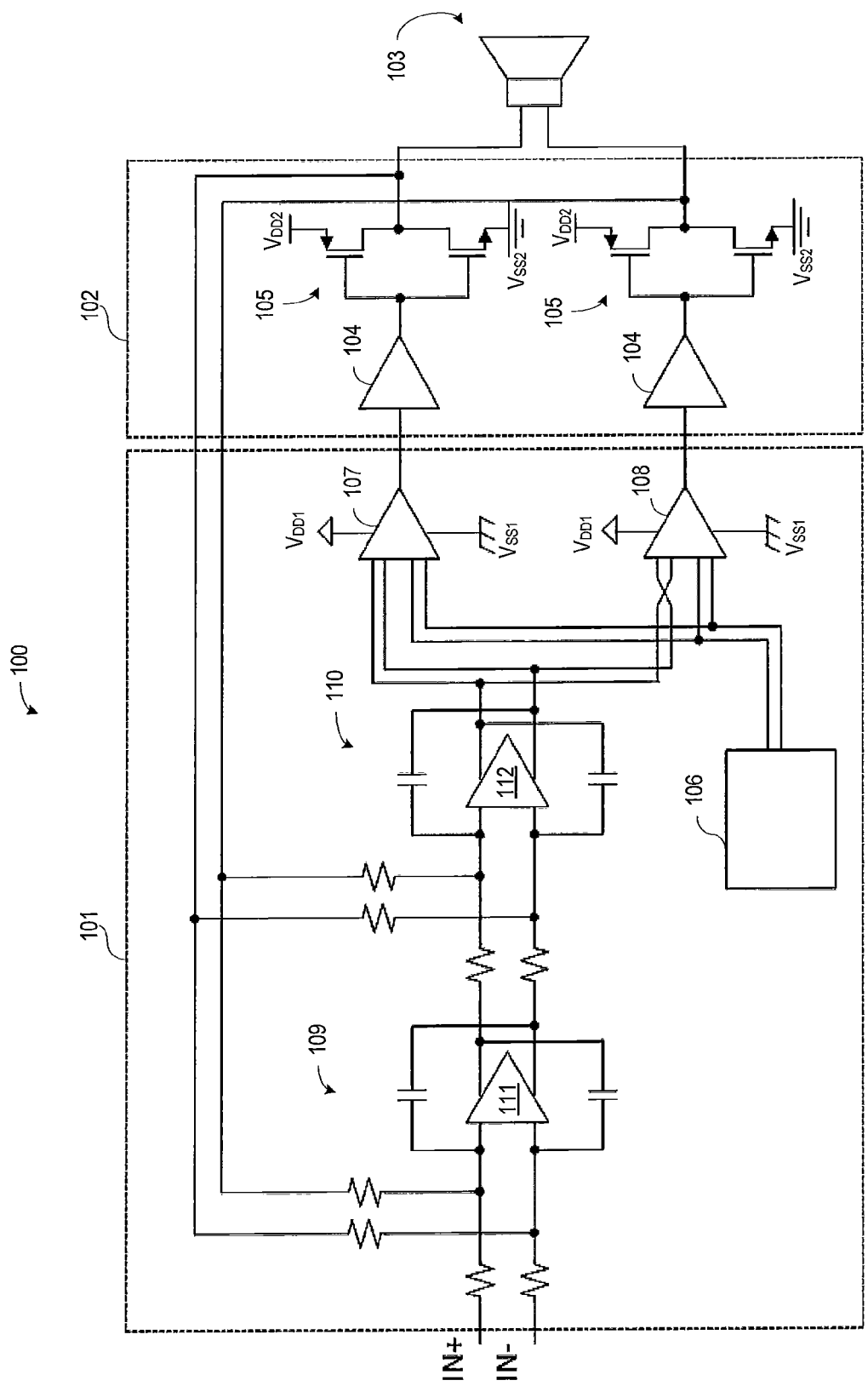
FIG. 1 illustrates generally an example of a conventional, differential, second-order, "filterless" class-D audio amplifier architecture.

FIG. 1 illustrates generally an example of a conventional, differential, 2nd order, "filterless" class-D audio amplifier architecture 100. The architecture 100 can include a modulator 101 and an output stage 102 configured to drive a load such as an audio transducer 103. The output stage 102 can include a level shift 104 and a driver 105, such as a complementary push-pull driver, for each output channel, such as a right channel and a left channel.

In an example, the modulator 101 can include a wave generator 106, such as a triangle wave generator, and comparators 107, 108 for providing pulse width modulated waveforms to the output stage 102. The modulator 101 can process an incoming signal IN+, IN− using first and second integrators 109, 110. In an example, the first integrator 109 can include a first operational amplifier 111. In an example, the second integrator 110 can include a second operational amplifier 112.

In an example, dual feedback loops can be coupled directly to the output of the output stage 102 and fed to the summing nodes of the first and second integrators 109, 110. Tapping feedback directly from the output stage—rather than from upstream, internal nodes—can produce an accurate reconstruction of the input signal (in the baseband) at the outputs by including the output section in the overall loop. However, coupling both feedback loops directly to the output of the output stage can produce variation in the energy fed back into the integrators that can negatively influence modulator stability, as well as, give rise to artifacts such as bimodal modulation.

Figure 2:
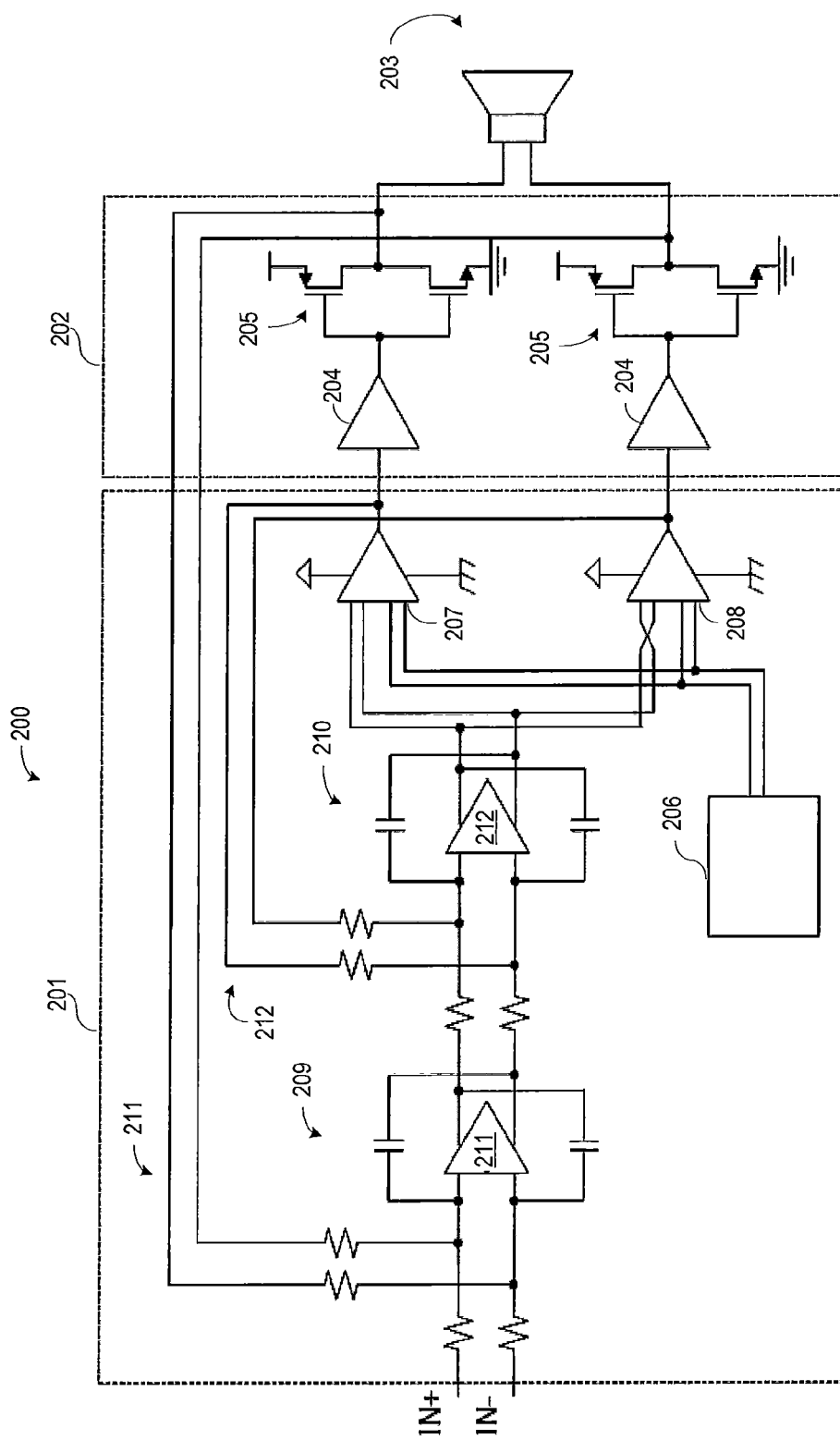
FIG. 2 illustrates generally an example of an improved dual feedback, class-D pulse-width-modulation (PWM) architecture.

FIG. 2 illustrates generally an example of an improved dual feedback, class-D PWM architecture 200. The architecture 200 can include a modulator 201 and an output stage 202 configured to drive a load, such as an audio transducer 203 for providing sound. The output stage 202 can include a level shift 204 and a driver 205, such as a complementary push-pull driver, for each output channel, such as a right channel and a left channel.

In an example, the modulator 201 can include a wave generator 206, such as a wave generator for providing a triangular waveform, and comparators 207, 208 for providing pulse width modulated waveforms to the output stage 202. The modulator 201 can process an incoming signal IN+, IN−, using first and second integrators 209, 210. In an example, the first integrator 209 can include a first operational amplifier 211. In an example, the second integrator 210 can include a second operational amplifier 212. In certain examples, a feedback path 212 to the second integrator 210 can be drawn from the internal comparator output nodes whose rail-to-rail swings can include $V_{SS1}$ to $V_{DD1}$. In certain examples, $V_{SS1}$ and $V_{DD1}$ can be regulated (constant) voltages—unlike $V_{DD2}$ and $V_{SS2}$, which can be drawn from a battery or other unregulated voltage source.

In an example, first and second comparators 107, 108 can receive output signals from the second integrator 210 and a periodic signal from the wave generator 206, and can provide pulse width modulated representations of the input signal IN+, IN−. In certain examples, the output stage 202 can receive the pulse width modulated representations of the input signal IN+, IN− and can provide an amplified, pulse width modulated version of the input signal IN+, IN−.

In certain examples, the amplifier architecture 200 can include a first feedback path 212 from an output of the output stage 202 to the first integrator 209. The first feedback path 211 can set overall amplifier baseband gain, and can generate the input error signal to minimize noise, distortion, and other non-idealities in the output signal caused by output stage nonlinearities.

In certain examples, a second feedback path 212 into the second integrator 210 of the class-D modulator can introduce a zero into the system transfer function, thus improving loop stability of the amplifier architecture 200. The second feedback path 212 does not substantially influence actual output fidelity (e.g., mitigation of distortion, noise) because the feedback signal is isolated from the input summing node by a very high gain stage (e.g., the first integrator 209). This isolation allows design freedom to change the second feedback path 212 signal source from the output of the output stage 202 to internal nodes that are nevertheless substantially representative of the output signals of the output stage 202, and in doing so, the second feedback path 212 does not compromise audio quality.

Figure 3:
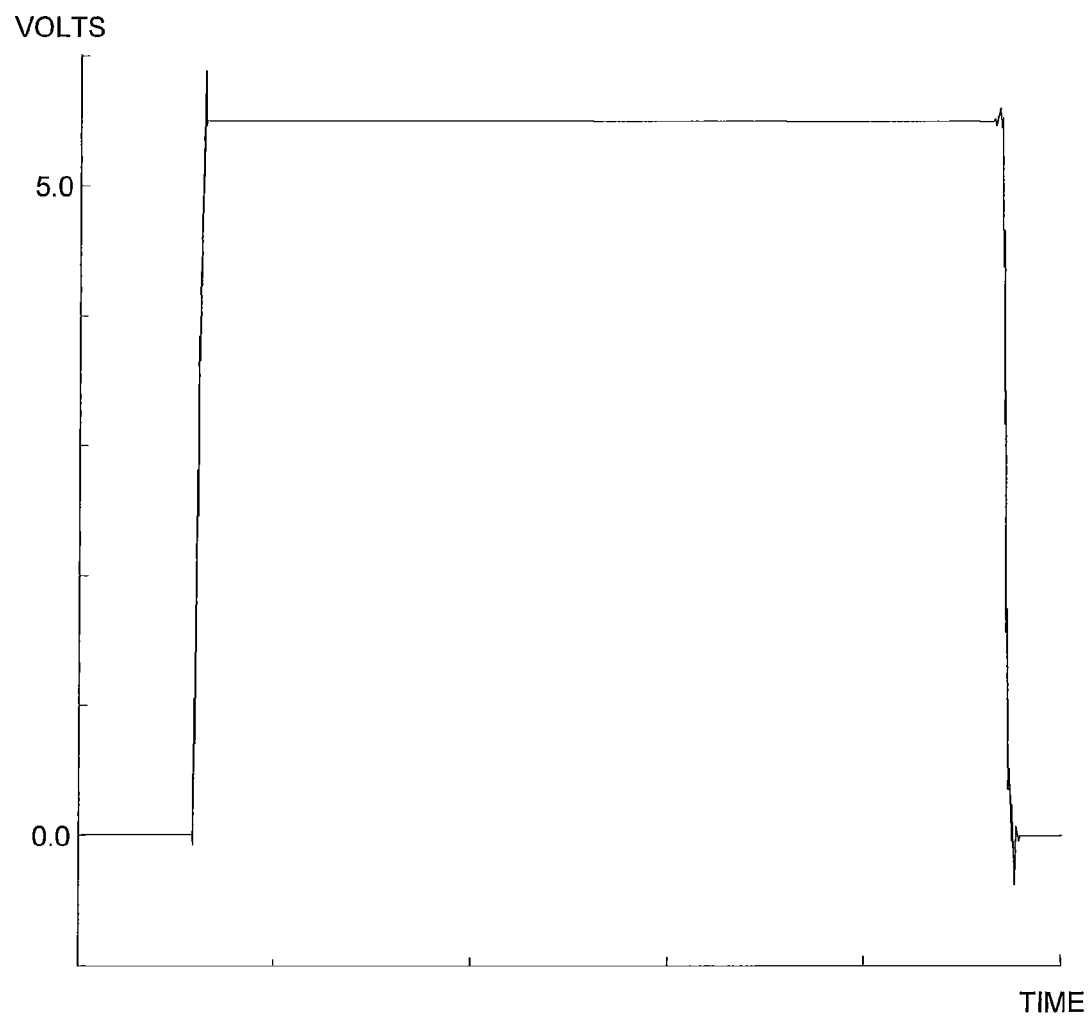
FIG. 3 illustrates a single, normal switching cycle of the outputs in the absence of bimodal behavior while amplifying a quiescent signal (silence).

Bimodal behavior of an amplifier circuit can arise when output supply voltage $V_{DD2}$ is at a high value, producing increased feedback energy to the modulator. In certain examples, bimodal modulation can be avoided by removing output supply voltage $V_{DD2}$ dependency from the second integrator feedback path 212. FIG. 3 shows a single, normal switching cycle of the outputs in the absence of bimodal behavior while amplifying a quiescent signal (silence). The positive and negative outputs of the output stage overlap, delivering zero energy to the differentially connected load (e.g., a speaker).

Figure 4:
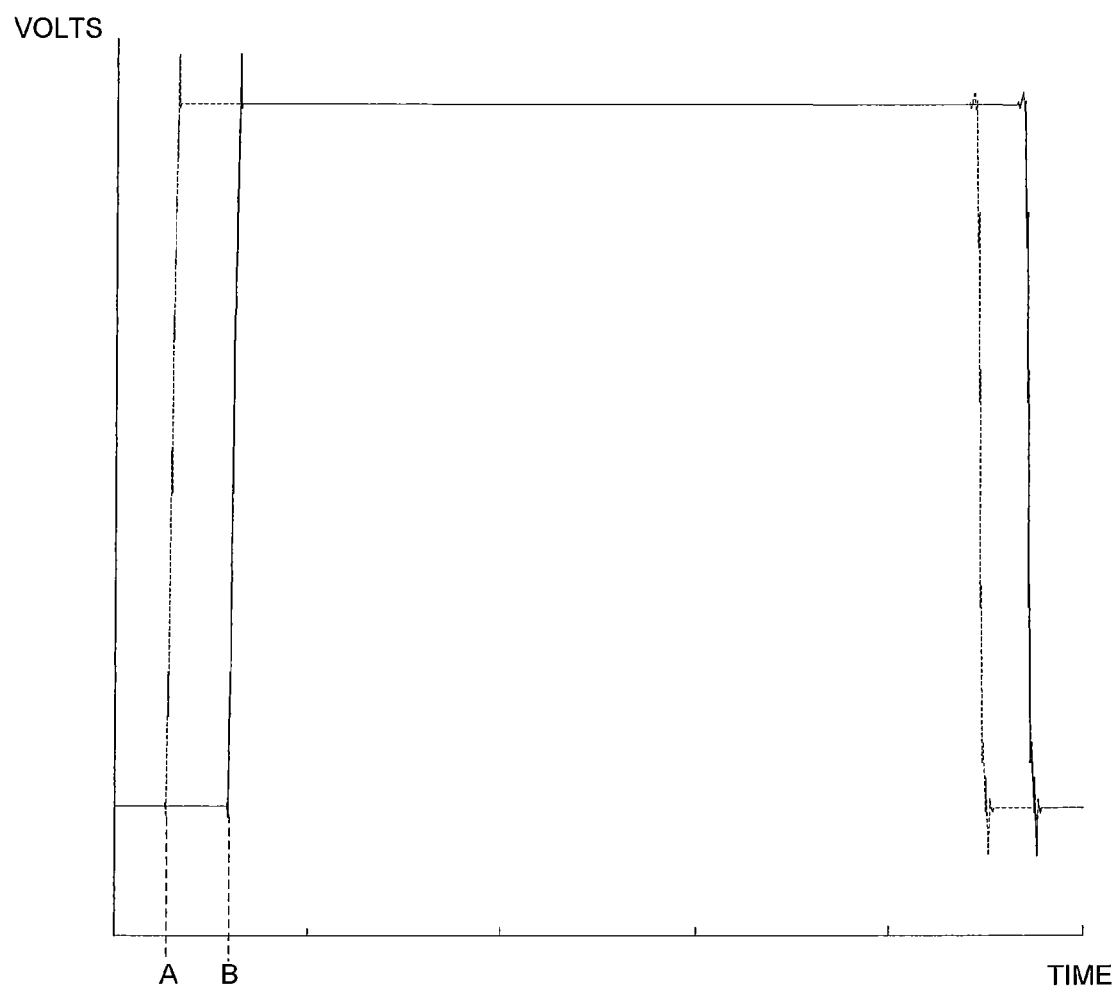
FIG. 4 illustrates the bimodal phenomenon, where one output is phase shifted with respect to the other.

FIG. 4 illustrates the bimodal phenomenon, where one output is phase shifted with respect to the other. In the example data illustrated, the positive output overlaps the negative output. Markers "A" and "B" show the time displacement. The average low frequency (baseband) differential energy is still zero, but some undesirable high frequency energy can be delivered to, and therefore wasted in, the load.

Figure 5:
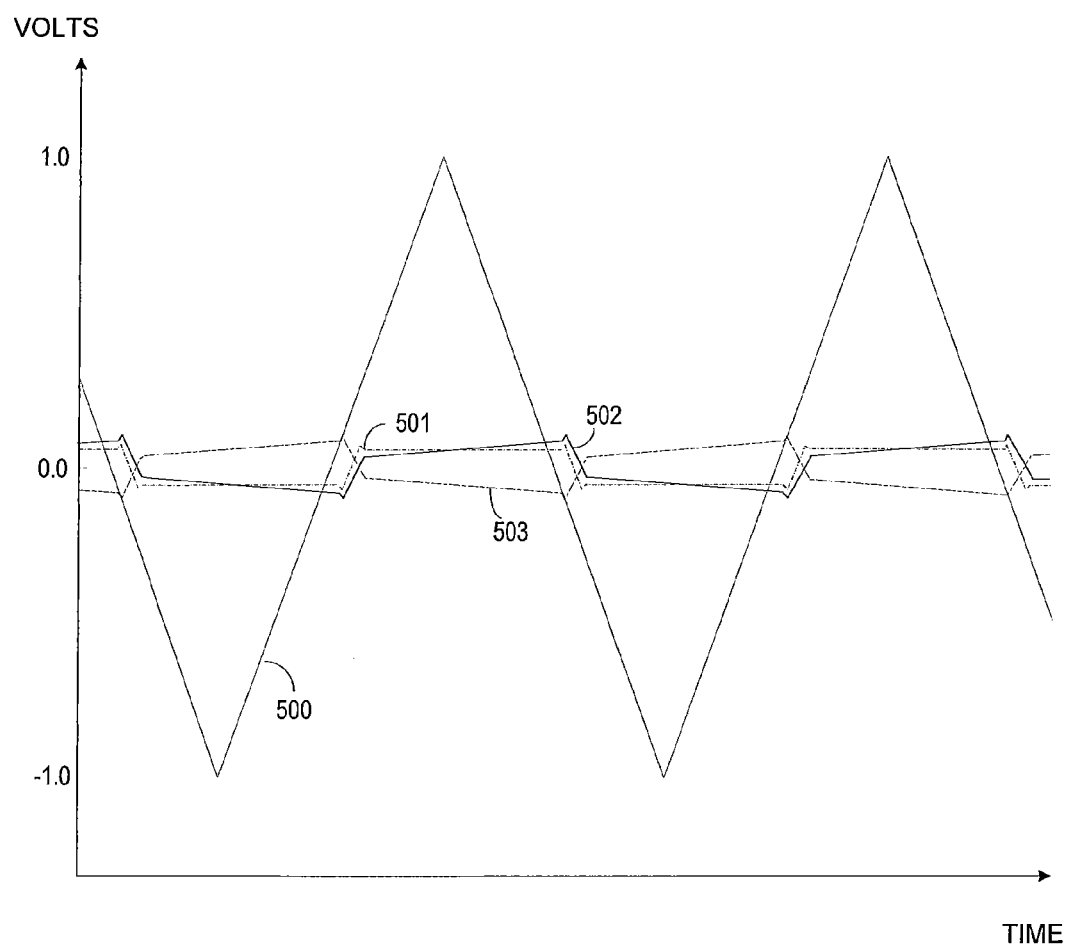
FIG. 5 illustrates internal signals in an improved modulator design with bimodal behavior present.

FIG. 5 illustrates internal signals in a modulator design with bimodal behavior present. The plot shows the triangular wave differential output 500, first integrator differential output 501, second integrator positive differential output 502, and second integrator negative differential output 503. The alternating differential error signal from the outputs (the period of time when the outputs oppose, e.g., do not overlap) causes the output of the first integrator to step above and below the zero baseline with each cycle. The second integrator responds by integrating the alternation. Additionally, when the outputs are in opposition, the second integrator can make rapid over corrections that can be influenced by the amplitude of the output supply voltage. The higher the output supply voltage, the greater an overcorrection amplitude can swing, hence, the greater the propensity of the system to exhibit and support bimodal operation.

Figure 6:
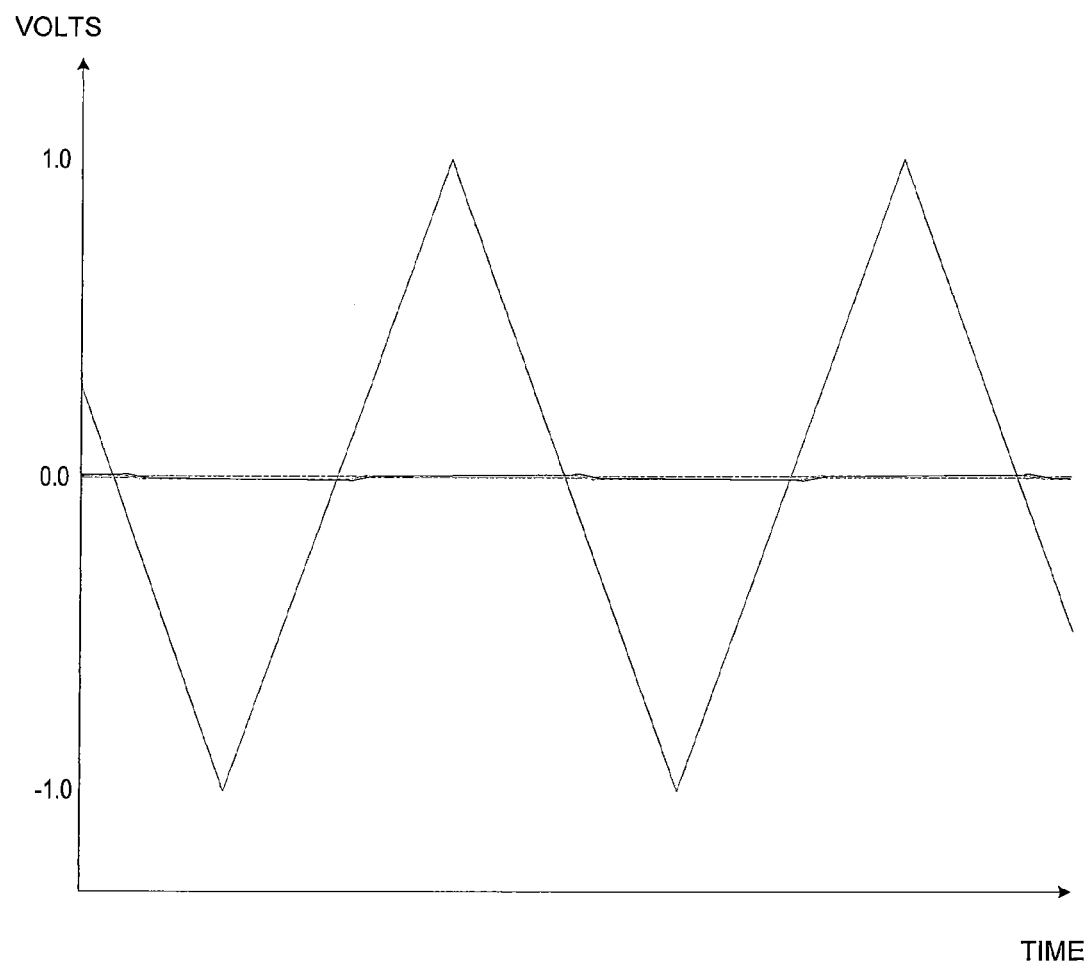
FIG. 6 illustrates generally internal signals of a second-order class-D modulator, with a modified feedback of the second stage.

Moving the source of the second integrator feedback signal from the variable voltage swing at the output of the output section to a constant, regulated internal voltage swing addresses the overcorrection of the second integrator, and can ameliorate the bimodal behavior, as shown in FIG. 6.

FIG. 6 illustrates generally internal signals of an improved second-order class-D modulator, such as a continuous-time sigma-delta type pulse width modulated class-D audio amplifier, with a modified feedback of the second stage that removes the amplitude dependency of the feedback from the amplitude of the voltage swing at the output stage. Elimination of the amplitude dependency results in stable loop operation over a wider range of supply voltage at the power supply rails of the output and mitigation of the possibility of anomalous artifacts such as bimodal behavior in the modulator. Mitigation of possible anomalous artifacts can provide improved user experience for a range of mobile electronics such as cell phones and other audio capable devices.

Additional Notes & Examples

In Example 1, an apparatus includes a first integrator configured to receive an input signal and a first feedback signal from an output stage, a second integrator configured to receive an output of the first integrator and a second feedback signal, and a comparator configured to be coupled to a regulated supply voltage, to receive an output of the second integrator and a modulation signal, and to provide a pulse width modulated representation of the input signal. In this example, the output stage is configured to be coupled to an unregulated supply voltage, and the second feedback signal includes a representation of an output of the comparator configured to reduce artifacts in the pulse width modulated representation of the input signal induced by changes in an amplitude of the unregulated supply voltage.

In Example 2, Example 1 can optionally include the output stage, wherein the output stage is configured to provide an amplified representation of the pulse width modulated representation of the input signal and the first feedback signal includes a representation of an output of the output stage.

In Example 3, the modulation signal of any one or more of Examples 1-2 optionally includes a periodic, triangular waveform.

In Example 4, any one or more of Examples 1-3 optionally includes a modulation signal generator configured to provide the modulation signal.

In Example 5, the modulation signal of any one or more of Examples 1-4 optionally includes a periodic, triangular waveform.

In Example 6, any one or more of Examples 1-5 optionally includes a second modulator including a third integrator configured to receive a second input signal and a third feedback signal from a second output stage, a fourth integrator configured to receive an output of the third integrator and a fourth feedback signal, and a second comparator configured to be coupled to the regulated supply voltage, to receive an output of the fourth integrator and the modulation signal, and to provide pulse width modulated representation of the second input signal. In this example, the second output stage is configured to be coupled to the unregulated supply voltage, and the fourth feedback signal includes a representation of an output of the second comparator and is configured to reduce artifacts in the pulse width modulated representation of the second input signal induced by changes in the amplitude of the unregulated supply voltage.

In Example 7, any one or more of Examples 1-6 optionally includes an integrated circuit including the modulator.

In Example 8, the integrated circuit of any one or more of Examples 1-7 optionally includes the output stage.

In Example 9, a system includes a modulator and an output stage. The modulator includes a first integrator configured to receive an input signal and a first feedback signal, a second integrator configured to receive an output of the first integrator and a second feedback signal, and a comparator configured to be coupled to a regulated supply voltage, to receive an output of the second integrator and a modulation signal, and to provide a pulse width modulated representation of the input signal. The output stage is configured to be coupled to an unregulated supply voltage and to provide an amplified representation of the pulse width modulated representation of the input signal. The first feedback signal includes a representation of an output of the output stage, and the second feedback signal includes a representation of an output of the comparator configured to reduce artifacts in the pulse width modulated representation of the input signal induced by changes in an amplitude of the unregulated supply voltage.

In Example 10, any one or more of Examples 1-9 optionally includes the output stage, wherein the output stage is configured to provide an amplified representation of the pulse width modulated representation of the input signal and the first feedback signal includes a representation of an output of the output stage.

In Example 11, the modulation signal of any one or more of Examples 1-10 optionally includes a periodic, triangular waveform.

In Example 12, any one or more of Examples 1-11 optionally includes a modulation signal generator configured to provide the modulation signal.

In Example 13, the modulation signal of any one or more of Examples 1-12 optionally includes a periodic, triangular waveform.

In Example 14, any one or more of Examples 1-13 optionally includes a battery configured to provide the unregulated supply voltage.

In Example 15, any one or more of Examples 1-14 optionally includes a speaker coupled to the output stage and configured to generate sound using the amplified representation of the pulse width modulated representation of the input signal.

In Example 16, a method includes receiving an input signal and a first feedback signal at a first integrator, receiving an output of the first integrator and a second feedback signal at a second integrator, comparing an output of the second integrator with a modulation signal at a comparator, providing a pulse width modulated representation of the input signal using the comparison of the output of the second integrator and the modulation signal, providing an amplified representation of the pulse width modulated representation of the input signal using an unregulated supply voltage. The providing the pulse width modulated representation of the input signal includes supplying the comparator with a regulated supply voltage, the receiving the input signal and the first feedback signal at the first integrator includes receiving a representation of the amplified representation of the pulse width modulated representation of the input signal from an output stage, and the second feedback signal includes a representation of the pulse width modulated representation of the input signal.

In Example 17, the comparing the output of the second integrator with the periodic modulation signal at the comparator of any one or more of Examples 1-16 optionally includes providing the modulation signal using a modulation signal generator coupled to the comparator.

In Example 18, the providing the modulation signal of any one or more of Examples 1-17 optionally includes providing a modulation signal having a triangular waveform.

In Example 19, a system or apparatus can include, or can optionally be combined with any portion or combination of any portions of any one or more of Examples 1-19 to include, means for performing any one or more of the functions of Examples 1-19, or a machine-readable medium including instructions that, when performed by a machine, cause the machine to perform any one or more of the functions of Examples 1-19.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An apparatus comprising:
   a modulator including:
      a first integrator configured to receive an input signal and a first feedback signal using a first feedback path coupled to an output stage;
      a second integrator configured to receive an output of the first integrator and a second feedback signal using a second feedback path coupled directly to an input of the output stage; and
      a comparator configured to be coupled to a regulated supply voltage, to receive an output of the second integrator and a modulation signal, and to provide a pulse width modulated representation of the input signal;
   wherein the output stage is configured to be coupled to an unregulated supply voltage; and
   wherein the second feedback signal includes a representation of an output of the comparator configured to reduce artifacts in the pulse width modulated representation of the input signal induced by changes in an amplitude of the unregulated supply voltage.

2. The apparatus of claim 1, including the output stage;
   wherein the output stage is configured to provide an amplified representation of the pulse width modulated representation of the input signal; and
   wherein the first feedback signal includes a representation of an output of the output stage.

3. The apparatus of claim 1, wherein the modulation signal includes a periodic, triangular waveform.

4. The apparatus of claim 1, including a modulation signal generator configured to provide the modulation signal.

5. The apparatus of claim 4, wherein the modulation signal includes a periodic, triangular waveform.

6. The apparatus of claim 1, including an integrated circuit including the modulator.

7. The apparatus of claim 6, wherein the integrated circuit includes the output stage.

8. A system, comprising:
   a modulator including:
      a first integrator configured to receive an input signal and a first feedback signal;
      a second integrator configured to receive an output of the first integrator and a second feedback signal; and
      a comparator configured to be coupled to a regulated supply voltage, to receive an output of the second integrator and a modulation signal, and to provide a pulse width modulated representation of the input signal;
   an output stage configured to be coupled to an unregulated supply voltage and to provide an amplified representation of the pulse width modulated representation of the input signal;
   a first feedback path coupled to the output stage and configured to provide the first feedback signal to the first integrator;
   a second feedback path couple directly to an input of the output stage and configured to provide the second feedback signal to the second integrator;
   wherein the first feedback signal includes a representation of an output of the output stage; and
   wherein the second feedback signal and includes a representation of an output of the comparator configured to reduce artifacts in the pulse width modulated representation of the input signal induced by changes in an amplitude of the unregulated supply voltage.

9. The system of claim 8, including the output stage;
   wherein the output stage is configured to provide an amplified representation of the pulse width modulated representation of the input signal; and
   wherein the first feedback signal includes a representation of an output of the output stage.

10. The system of claim 8, wherein the modulation signal includes a periodic, triangular waveform.

11. The system of claim 8, including a modulation signal generator configured to provide the modulation signal.

12. The system of claim 11, wherein the modulation signal includes a periodic, triangular waveform.

13. The system of claim 8, including a battery configured to provide the unregulated supply voltage.

14. The system of claim 8, including a speaker coupled to the output stage and configured to generate sound using the amplified representation of the pulse width modulated representation of the input signal.

15. A method comprising:
   receiving an input signal and a first feedback signal at a first integrator;
   receiving an output of the first integrator and a second feedback signal at a second integrator;
   comparing an output of the second integrator with a modulation signal at a comparator;
   providing a pulse width modulated representation of the input signal using the comparison of the output of the second integrator and the modulation signal;
   providing an amplified representation of the pulse width modulated representation of the input signal using an unregulated supply voltage;
   wherein providing the pulse width modulated representation of the input signal includes supplying the comparator with a regulated supply voltage;
   wherein receiving the input signal and the first feedback signal at the first integrator includes receiving a representation of the amplified representation of the pulse width modulated representation of the input signal from an output of an output stage; and wherein receiving the second feedback signal at the second integrator includes receiving, from an input of the output stage, a representation of the pulse width modulated representation of the input signal.

16. The method of claim 15, wherein the comparing the output of the second integrator with the periodic modulation signal at the comparator includes providing the modulation signal using a modulation signal generator coupled to the comparator.

17. The method of claim 16, wherein the providing the modulation signal includes providing a modulation signal having a triangular waveform.

* * * * *